(12) United States Patent
Janzén et al.

(10) Patent No.: US 7,361,222 B2
(45) Date of Patent: Apr. 22, 2008

(54) DEVICE AND METHOD FOR PRODUCING SINGLE CRYSTALS BY VAPOR DEPOSITION

(75) Inventors: Erik Janzén, Borensberg (SE); Peter Råback, Vaasa (FI); Alexandre Ellison, Linköping (SE)

(73) Assignee: Norstel AB, Linköping (SE)

( * ) Notice: Subject to any disclaimer, the term of this patent is extended or adjusted under 35 U.S.C. 154(b) by 374 days.

(21) Appl. No.: 10/830,047

(22) Filed: Apr. 23, 2004

(65) Prior Publication Data

US 2005/0000406 A1    Jan. 6, 2005

Related U.S. Application Data

(60) Provisional application No. 60/465,800, filed on Apr. 28, 2003.

(30) Foreign Application Priority Data

Apr. 24, 2003    (SE) .................................. 0301225

(51) Int. Cl.
*C30B 29/36*    (2006.01)

(52) U.S. Cl. .................. 117/103; 117/104; 117/94; 117/95; 117/945

(58) Field of Classification Search ............... 117/103, 117/104, 94, 95, 945; 118/715 R
See application file for complete search history.

(56) References Cited

U.S. PATENT DOCUMENTS

| | | | |
|---|---|---|---|
| 5,704,985 A * | 1/1998 | Kordina et al. ............. | 118/725 |
| 5,851,589 A | 12/1998 | Nakayama et al. | |
| 5,985,024 A | 11/1999 | Balakrishna et al. | |
| 6,039,812 A | 3/2000 | Ellison et al. | |
| 6,048,396 A | 4/2000 | Vehanen et al. | |
| 6,048,398 A | 4/2000 | Vehanen et al. | |
| 6,281,098 B1 | 8/2001 | Wang et al. | |
| 6,299,683 B1 | 10/2001 | Rupp et al. | |
| 2002/0056411 A1 | 5/2002 | Hara et al. | |

(Continued)

FOREIGN PATENT DOCUMENTS

EP    0554047 A1    8/1993

(Continued)

OTHER PUBLICATIONS

Von J.A. Lely; Darstellung vn Einkristallen von Siliciumcarbid und Beherrschung von Art and Menge der eingebauten Verunreinigungen; Berichte der Deutschen Keramischen Gesellschaft e.V.; Aug. 1955; pp. 229-231.

(Continued)

*Primary Examiner*—Robert Kunemund
(74) *Attorney, Agent, or Firm*—Venable LLP; Eric J. Franklin

(57) ABSTRACT

A method and a device to grow from the vapor phase, a single crystal of either SiC, a group III-nitride, or alloys thereof, at a growth rate and for a period of time sufficient to produce a crystal of preferably several centimeters length. The diameter of the growing crystal may be controlled. To prevent the formation of undesirable polycrystalline deposits on surfaces in the downstream vicinity of the single crystal growth area, the local supersaturation of at least one component of the material grown is lowered by introducing a separate gas flow comprising at least one halogen element or a combination of said halogen and hydrogen species.

16 Claims, 6 Drawing Sheets

U.S. PATENT DOCUMENTS

| | | | |
|---|---|---|---|
| 2002/0056412 A1* | 5/2002 | Hara et al. ............... | 117/84 |
| 2004/0231583 A1* | 11/2004 | Hara et al. ............... | 117/89 |

FOREIGN PATENT DOCUMENTS

| | | |
|---|---|---|
| EP | 0554047 B1 | 11/1995 |
| EP | 0787822 B1 | 3/2001 |
| EP | 1205583 | 5/2002 |
| GB | 1231993 | 5/1971 |
| GB | 2218567 A | 11/1989 |
| JP | 63033568 A | 2/1988 |
| JP | 2002362998 A | 12/2002 |
| WO | WO98/14644 A1 | 4/1998 |
| WO | WO-2004/111316 A1 | 12/2004 |

OTHER PUBLICATIONS

Yu M. Tairov and V.F. Tsvetkov; General Principles of Growing Large-Size Single Crystals of Various Silicon Carbide Polytypes; Journal of Crystal Growth 52 (1981) 146-150; pp. 146-150; North-Holland Publishing Company.

J. Zhang, O. Kordina, A. Ellison and E. Janzén; In Situ Etching of 4H-SiC in $H_2$ with Additional of HCl for Epitaxial CVD Growth; Materials Science Forum vols. 389-393 (2002); pp. 239-242:2002 Trans Tech Publications, Switzerland.

* cited by examiner

DEVICE AND METHOD FOR PRODUCING SINGLE CRYSTALS BY VAPOR DEPOSITION

CROSS-REFERENCE TO RELATED APPLICATIONS

This application claims priority to U.S. provisional patent application No. 60/465,800 filed Apr. 28, 2003 and Swedish patent application 0301225-9 filed Apr. 24, 2003.

FIELD OF THE INVENTION

The present invention describes a device and a method to grow single crystals by high temperature deposition from a vapor phase. In particular the device can be used to produce large and high quality bulk crystals of a) silicon carbide, b) a group III-nitride, for example GaN or AlN, or c) an alloy of SiC and a group III-nitride.

BACKGROUND AND PRIOR ART

Wide band-gap semiconducting crystals such as silicon carbide (SiC), group III-nitrides e.g. gallium nitride (GaN) and aluminum nitride (AlN); offer several attractive electrical and physical properties for fast switching power devices and optoelectronic devices. These wide band gap semiconductors and their alloys also differentiate themselves from other important semiconductors, such as silicon and gallium arsenide, by the fact that they cannot at present be directly grown from a melt or a liquid solution under practically and economically interesting conditions. Instead, ingots of SiC, GaN or AlN are usually grown from the vapor phase, by the epitaxial deposition of a supersaturated vapor flux onto a seed crystal.

In the case of SiC, the first method developed to produce semiconductor grade SiC crystals (also called ingots or boules) of diameter and length sufficient to manufacture wafers for device applications, is the sublimation method, also known as physical vapor transport (PVT). The core concept of this method has been introduced by Lely in 1955 (Berichte der Deutschen Keramische, Ges. 32-8 p. 229 (1955) and has been modified in 1978 by Tairov and Tsvetkov (J. Cryst. Growth 52, p. 146 (1981) to produce consistent semiconductor grade SiC crystals where key properties such as the polytype and the growth rate of the crystal can be controlled. Briefly, the method is based on the use of a sealed crucible in which a temperature gradient is established between a high temperature zone, where a solid source material such as a SiC powder is sublimed, and a lower temperature region in which the sublimed species crystallize on a seed crystal.

The sublimation method is at present also developed by different groups for the growth of AlN and GaN bulk crystals, while hydride vapor phase epitaxy and liquid phase techniques are also being investigated for the growth of bulk GaN crystals.

The sublimation method allows today the production of SiC wafers of diameters of 50 and up to 100 mm with entry quality and cost sufficient to enable industrial manufacturing of devices such as LEDs and Schottky diodes.

Despite these achievements, there are however some challenges and limits in the sublimation technique. For example, as long as no continuous feeding mechanism can be devised, the initial mass of the feedstock limits the duration of a continuous crystal growth process and thus the crystal length. One difficulty may, for example, be the need to control a changing sublimation rate and a drift of the sublimed species stoichiometry during growth. Instabilities in the source material supply and drifts of the temperature distribution in the source feedstock, for example, cause drifts of the growth rate and of the incorporation of doping species. If not properly controlled, such drifts tend to adversely affect the yield of the crystal growth process.

These challenges may be solved by further improvements of the sublimation process, and in the case of SiC, the capability of the technique to produce wafers on a relatively large scale, is an indication of its industrial potential.

An alternative industrially interesting technique, which does provide a continuous control of the source material supply together with the potential of growing long crystals from the vapor phase has been introduced in 1995 by U.S. Pat. No. 5,704,985. This technique is generically described as High Temperature Chemical Vapor Deposition (HTCVD) and differs from sealed PVT configuration by making use of an open hot-wall configuration offering an accurate control in the supply of the source and doping materials. In particular, at least one of the components of the grown material is continuously supplied in the form of a regulated gas flow and fed into a high temperature region through an inlet opening. Additionally, an exhaust is provided downstream of the crystallization region to control the gas flow along the growing crystal surfaces and exhaust the by-products resulting from the crystallization process. The technique may be described as Chemical Vapor Deposition (CVD) owing to its conceptual similarity with the CVD techniques used to grow epitaxial layers of 0.1 to 200 μm thickness. However, as taught in U.S. Pat. No. 5,704,985 and No. 6,048,398, in order to reach growth rates economically interesting for producing large bulk crystals, the HTCVD technique uses an order of magnitude higher source gases feed rates and several hundreds degrees higher temperatures than normal CVD processes.

For example, in a device similar to the one of the first figures of U.S. Pat. No. 5,704,985 (FIG. 1), in the specific case of SiC, by heating the seed crystal (13) to a temperature of 2250° C. and feeding via inlet 15 a gas mixture containing 0.3 L/min of silane and 0.1 L/min of ethylene diluted in a carrier gas, a growth rate of 0.5 mm/h is obtained.

However, when carrying out the method for several hours, it is experimentally observed that SiC also crystallizes around the seed crystal substrate (13), onto the holder (12) made for example of graphite, and on the exposed surfaces of the exhaust holes (14) in FIG. 1. On the surfaces in the immediate vicinity of the seed crystal (13), SiC crystallizes in a dense polycrystalline solid comprising mainly 6H and 15R polytypes. Further downstream in the exhaust holes 14, SiC crystallizes in somewhat less dense polycrystalline grains, often needle shaped and of the 3C polytype. The dense polycrystalline deposition can occur at a rate approximately twice that of the single crystal crystallization rate. Further downstream, as the temperatures decreases and the supersaturation increases, the less dense polycrystalline deposits grow even faster, eventually obstructing the gases outlet path within 2 to 4 hours. Once the exhaust path downstream of the seed crystal is sufficiently obstructed, a pressure difference rapidly builds up between the sources gases inlet 15 and the exhaust port 16. If the pressure differential is allowed to reach a few mbars, a rapid deterioration of the polytype and the structural quality of the single crystal occurs. The source gases can also start to flow along a path of higher conductance than the one of the obstructed exhaust 14, for example through any porous insulating material such as 15 in FIG. 1. The thermal properties of the insulating material are then rapidly deteriorating due to reaction with silicon, which forces the growth to be interrupted. Alternatively, when the exhaust path 14 becomes obstructed under conditions where the source gases are not allowed to find a path of higher conductance, a very rapid blocking of the gases inlet conduct takes place by polycrystalline silicon deposition. In this case, the growth also needs to be interrupted as no source gases can be supplied to the single crystal.

The parasitic deposition of polycrystalline solid phases thus leads to a catastrophic runaway of the system, forcing to terminate the growth process before a crystal of a desired length is produced.

A tentative solution to solve this problem has been presented in the PCT application WO 98/14644. In the example of SiC crystal growth, this application describes a device where the Si and C containing process gases are separated from the main heating element 7 in FIG. 2 by a thin inner cylinder 25. A blanketing inert gas is forced to flow between the main heating element and the inner cylinder, the inner cylinder ending at a distance approximately corresponding to the single crystal growth front. Downstream of the single crystal growth front, the blanketing gas guided along the walls of the main heating cylinder, is meant to prevent or substantially slow down deposition of polycrystalline SiC on the downstream inner walls and to slow down growth of polycrystalline SiC on the seed holder 13, so that the outlet path 31 remains free. A similar solution is presented in the European patent application no. 787,822 A1 where an inert blanketing gas flowing parallel to the process gases stream is presented for a device operating between 800 and 2500° C.

It has been found that this solution, as presented in or derived from these documents, does not solve the problem described above to an extent sufficient to grow SiC or other crystals of a length more than a few mm. Experiments using an inert blanketing gas, such as helium or argon, showed that too rapid polycrystalline deposition still occurred on the downstream regions of the single crystal growth front. When helium is used as blanketing gas, an even higher polycrystals growth rate is easily obtained, whereas the use of argon only pushes the deposition region a short distance downstream. This unexpected result can be explained by an additional flux of carbon carried by the blanketing gas when it passes along a graphite made uncoated heating element and by the differing thermal conductivity of the two considered gases. In a silicon rich exhaust gas mixture, any additional carbon supply leads to an increase of the downstream growth of polycrystalline SiC. A similar phenomenon is observed when using a heating element 7 coated with SiC. To circumvent this, it will be obvious to a person skilled in the art to use, as an improvement, a heating element and guide coated with a metal carbide such as for example TaC or NbC. Preferably the exposed surfaces will also have a low surface roughness to offer less nucleation sites to polycrystalline SiC. Under typical process conditions leading to a single crystal growth rate of 0.5 to 1 mm/h, it is however observed that such a design only leads to a further downstream location of the uncontrollable polycrystalline SiC deposition. This small improvement of the blocking time is not sufficient to continuously grow several cm long crystals.

In other prior art devices designed to grow SiC crystals where at least one component of the material to be grown is fed as a gas and the by-products of the process are exhausted via an opening in the crucible, no solution to parasitic deposition of the polycrystalline form of the material to be grown is mentioned. For example, European patent 554,047 B1 teaches the growth of SiC crystals by a device using silane and propane as source gases which react in a first reaction zone to form SiC particles to be subsequently evaporated in a lower pressure sublimation zone. The by-products of the crystallization process and the carrier gas are just said to be exhausted through an outlet. In U.S. Pat. No. 5,985,024, filed in 1997, a device is disclosed where silicon vapor is supplied from a heated silicon melt and an hydrocarbon gas such as propane is supplied into the growth zone through a gas supply inlet. In this device, the excess gas downstream of the growing SiC ingot is also just said to be removed from the growth zone by means of a passageway, or outlet channel. As a decreasing temperature distribution is required in or next to the seed holder to promote the growth of the single SiC crystal, it is believed that such passageways will inevitably by subject to a catastrophic blocking by either polycrystalline SiC, pyrolytic graphite or polycrystalline Si deposition. A similar concept is described in U.S. Pat. No. 6,048,398 filed in 1995 where a molten silicon feedstock in combination with a hydrocarbon gas can be used as source gases. The excess gases are exhausted downstream of a seed crystal holder which is rotated and pulled as the single crystal growth proceeds. Despite a beneficial cleaning action of polycrystalline deposits induced by the rotation of the seed holder, such a mechanical cleaning induces stresses in either the rotation mechanism or the seed holder and the elements coming in contact with it. This can lead to mechanical failure of any of the above mentioned parts.

In U.S. patent application no. 2002/0056411 A1, a high temperature vapor deposition apparatus to produce SiC ingots is discussed where the pressure of the gas mixture in the growth region is set higher than that of the exhaust gas mixture to increase the yield of the process. This pressure difference can be achieved by designing the apparatus so that the conductance of the inlet is made higher than the one of the outlet. After a low conductance situated downstream of the single crystal growth zone, the decreased pressure of the exhaust gas mixture causes, at constant temperature, a decrease of the deposition rate of parasitic polycrystalline material. This slows down in any catastrophic blocking along the path downstream of the conductance reducing region of the exhaust. However, as pointed out in the cited application, as the temperature decreases along this downstream path, deposits will again accumulate in a given region, described as gas trap. Preventing these deposits would allow to continue the process for a longer time and to produce longer crystals. Moreover, in this application, the system must be operated at a reduced pressure at least in the downstream part of the conductance reducing region. It can be desirable to instead operate the device at substantially atmospheric pressure, both in the growth zone and in the outlet zone, as this can favor both higher yields and lower cost of the complete system.

It may be noted, that the origin of the problem described above is in a sense fundamental, even if the maximum mass transport of Si-species is arranged at the single crystal growth front. As the growth takes place at high temperature to promote high growth rates and high crystalline quality, to prevent the surface from being graphitized, an amount of Si-vapor at least equal to the equilibrium Si pressure of the heated crystal surface is continuously exhausted downstream of the growth front.

PURPOSE AND SUMMARY OF THE INVENTION

Preferred embodiments of the invention provide a method and a device to grow at a high temperature in a heated room (called susceptor or crucible), from the vapor phase, a single crystal of either SiC, a group III-nitride, or alloys thereof, at a growth rate and for a period of time sufficient to produce a crystal of several millimeters, or preferably several centimeters, length.

In particular, it is an object of preferred embodiments of the invention to slow down or eliminate the formation of polycrystalline and other solid deposits downstream of the single crystal crystallization area to avoid a partial or complete obstruction of a susceptor exhaust path by a gas mixture fed to the crystallization area. A correlated purpose of preferred embodiments of the invention is to control the diameter of the growing single crystal and prevent growth of polycrystalline material around it, thereby preventing structural defects generation during either the high temperature growth phase or the subsequent cooling phase.

A further object of preferred embodiments of the invention is to decrease the concentration of unwanted metallic impurities in the growing single crystal by removing from the vapor phase active metallic elements released by parts heated downstream of the crystallization area.

To prevent the formation of undesirable polycrystalline deposits on surfaces in the vicinity and in any region downstream of the single crystal growth area, preferred embodiments of the invention propose to lower the local supersaturation of at least one component of the material grown by introducing, in the vicinity of these surfaces, a separate gas flow having the chemical property of etching the deposits. In the case of SiC or GaN crystal growth, a gas flow containing at least one halogen element such as hydrogen chloride, chorine or a mixture of hydrogen and either chlorine or hydrogen chloride is preferably used as etchant. As will become apparent from the detailed description of preferred embodiments of the invention, other gases or gas mixtures containing halogens such as Br, F or I may also be used for a similar purpose. The etching gas may also be distributed in such a manner to actively control the shape of the growing crystal. Further preferred features and advantages of the invention are made apparent and described in the following drawings and description.

DETAILED DESCRIPTION OF THE INVENTION

Figure 3:
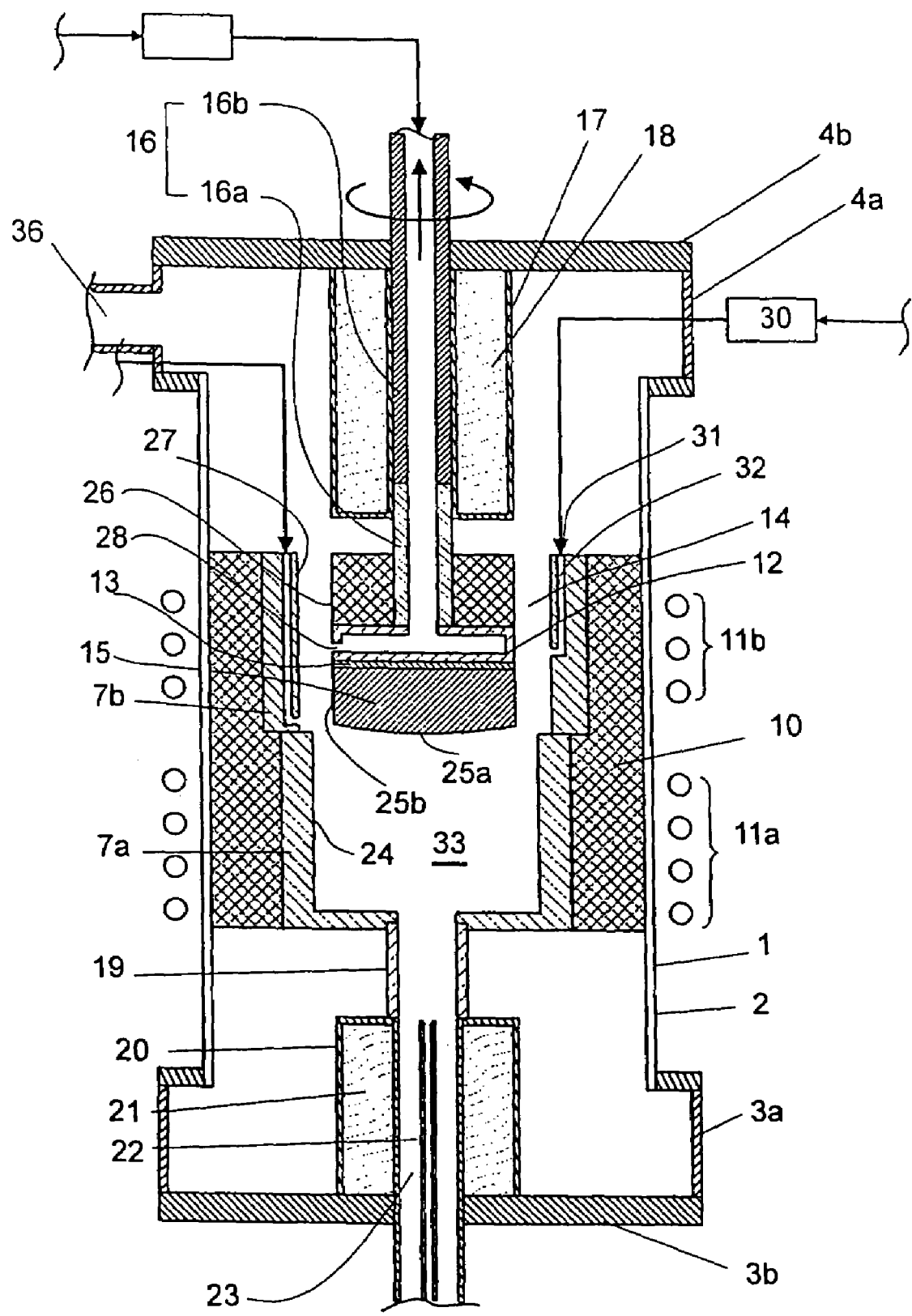
FIG. 3 is a cross section of a device according to an embodiment of the invention.

FIG. 3 schematically shows an improved device comprising a growth chamber of a HTCVD system based on the concepts described in the U.S. Pat. Nos. 5,704,985, 6,039,812 and 6,048,398. This device will also be described here as preferred embodiments of the device of the invention may have a similar principle construction as in the above mentioned documents but differ in the particular features and improvements described herein. The device of FIG. 3 is suited to grow single crystals of SiC or of a group-III nitride. Some parts are for the sake of simplicity schematized and it is obvious to a person skilled in the technical field that the device also comprises elements such as mass flow controllers, valves, pumps, control electronics, purifiers, a scrubbing system and other elements, as is common practice in CVD systems.

The high temperature chemical vapor deposition device comprises a casing 1 constituted, for example, of a single wall quartz tube 2 tightly mounted between a lower flange 3 and an upper flange 4. Each flange comprises a fixed casing 3a and 4a and a movable lower 3b and upper 4b lids which can be lowered or lifted, respectively, to access the interior of the casing 1 for loading and unloading the hot-zone of the device. The casing 1 may alternatively be constituted by a double wall water-cooled quartz tube or can be surrounded by a water cooled stainless steel casing (not shown). The interior of the casing 1 comprises a heater 7, also called susceptor or crucible in the literature, and may be surrounded by a low conductivity thermally insulating material 10 such as carbon felt or other forms or materials compatible with the temperature range of the process and its heating means. The heater 7 may be axis symmetric and may be made of a material compatible with high temperatures such as uncoated or coated graphite, a metal carbide or nitride, or a combination thereof. The heater may be of cylindrical shape, however, the diameter of the heating element may axially vary to converge in certain regions or diverge in other regions to achieve a specific gas flow pattern or a specific spatial temperature distribution in the heater 7 and in the vicinity of the crystal holder 12. The susceptor 7 may be heated either by RF induction through a coil 11, or by resistive heating, to a temperature above 1900° C. (and preferably in the range of 2000° C. to 2600° C.) for SiC crystal growth, or above 1200° C. (at least 1100° C. and preferably in the range of 1200° C. to 2200° C.) for GaN crystal growth. A seed crystal 13 is mounted by mechanical or chemical means to a seed holder 12 which is physically attached to a shaft 16 having at least one hollow conduit through which the temperature of the seed holder can be measured by an optical pyrometer or thermocouple (not shown). To obtain a preferential crystallization on the seed crystal surface rather than on the surface 24 of the susceptor 7, the seed holder may be maintained at a lower temperature than the surface 24 and upper part of room 33, thereby establishing a temperature gradient. The crystallization process may be carried out by feeding a vapor phase containing the elements of the material to be grown through the heated susceptor 7 towards the seed crystal. The elements amounts of the crystal to be grown may be chosen so that the heated vapor becomes supersaturated when reaching the crystallization front, here called the growth front 25a. In the specific case of SiC growth, the susceptor 7 may be heated to temperatures ranging from 2100 to 2600° C. while the seed holder may be maintained at temperatures ranging from 2000 to 2400° C., depending on the source material feeding rate and its C/Si ratio, the polytype and the crystallographic orientation of the seed crystal. A preferred source material for growth of SiC ingots consists of a $SiH_xCl_y$ gas or liquid (x=0 to 4, y=0 to 4) and a hydrocarbon such as methane, ethylene or propane. As described in U.S. Pat. No. 6,039, 812, the Si containing gas or liquid is fed through an inner conduit 22. The hydrocarbon gas may either be fed in the same inner conduit 22 or in a concentric annular conduit 23 surrounding the inner conduit 22 and delimited by a water cooled stainless steel flange 21 part of the lower lid 3b. A carrier gas such as hydrogen, helium, argon or a mixture thereof is also fed into conduit 23 and exhausted downstream of the growth front 25a via an outlet channel 14. The feeding means for each precursor and gas, from its substantially room temperature storage, includes mass flow controllers, valves and other components as commonly practiced in CVD systems. The source material may alternatively consist of a combination of gas precursors and elements vaporized from a liquid or solid source, stored in a lower portion of the susceptor 7a or in a separate crucible, such as a carbon or silicon carbide powder.

Alternatively, in the case of GaN growth, a metalorganic source such as trimethylgallium (TMG) and a nitrogen containing gas may be used as source materials.

In order to prevent deposition of polycrystalline silicon carbide along the surfaces 26 and 27 of the exhaust channel 14, the device comprises additional delivery means such as channels emerging in the vicinity of the single crystal growth zone or in any downstream heated part exposed to Si and C containing gases. A gas mixture having the property of chemically etching SiC may be fed through these additional channels. It has been found that the etching gas mixture shall in the case of SiC growth include at least one halogen element to neutralize the Si containing vapor species. The etching gas mixture preferably also has the property to react with carbon containing vapor species, such as hydrogen. Efficient etching gas mixtures providing the desired result have been found to be gases such as chlorine (Cl2), hydrogen chloride (HCl) or a mixture of hydrogen (H2) and hydrogen chloride or chlorine. A gas mixture containing halogens such as fluorine (F) or iodine (I) and hydrogen also achieves the desired etching effect.

To provide etching rates comparable to the growth rates of monocrystalline and polycrystalline SiC practiced in the invention (0.5 to 2 mm/h or more), at least one part of the etching gas may be delivered before the exhaust gases are cooled down to a temperature 600° C. lower than the temperature of the single crystal growth front 25a. In order to maintain the exhaust path 14 free, the positioning of the etching gas mixture delivery means, the amounts and ratio of halogen and hydrogen gases introduced shall match the amount of Si and C containing vapor species and the temperature of the surfaces exposed to condensation and the conductance of the exhaust gap 14.

As shown in FIG. 3, a preferential delivery means is realized by delivering a controlled flow of the etch gas through the hollow core of shafts 16a and 16b into an inner delivery cavity machined in the seed holder 12. The etch gas mixture may be allowed to escape through channels or pores 28 located above the seed crystal 13 and mix with the Si and C containing vapor having passed the growth front 25a.

The etch gas mixture may be thereby heated to a temperature similar to the seed holder temperature, typically 2000 to 2400° C., and thus may very efficiently react with the Si and C containing vapor species. It may be noted that a plurality of delivery configurations can be used in the seed holder 12 in order to achieve an even distribution of the etch gas. For example a plurality of circumferential holes with a diameter ranging from 0.1 to several mm may be distributed along the outer surface 26 of the seed holder 12. A high porosity ring may also be used, provided it is made of a high temperature resistant material chemically inert to the etch gas mixture (e.g. graphite when a pure halogen gas such as F2 or Cl2 is used). An important advantage of this first delivery means is that, as the shaft 16 is translated upwards at a rate similar to the SiC ingot 15 growth rate, by a pulling unit (not shown), the etch gas flow may be delivered at a fixed position along the surface 26 of the seed holder assembly in relation to the crystal growth front 25a. This may allow surface 27 to be maintained free of parasitic solid deposits even when the crystal grows to a length of several centimeters and is pulled a corresponding height upwards. A preferential practice of the invention includes pulling the seed holder 12 along a predetermined axial temperature profile to maintain the temperature of the crystallization surface 25a constant as the crystal length increases. As the seed holder 12 is pulled along this temperature profile, the etch gas flow rate can be ramped over time to maintain a constant etching rate. Another advantage of this first delivery means is that the temperature difference between the seed holder 12 and the lower heater 7a can be increased, without provoking a higher deposition rate of polycrystalline material downstream of the single crystal 15. This can, for example, be achieved by lowering the RF power in the upstream turns 11a of the induction coil, while increasing the feed rate of the etch gas mixture into the shaft unit 16 to compensate for the higher supersaturation of Si and C containing gases.

A second delivery means for the etch gas mixture fulfilling the purposes of the invention comprises feeding the etch gas into a channel in the upper part 7b of the heater surrounding the seed crystal holder 12. The etch gas feed rate is controlled by an external flow controller 30 and fed into the casing 4a through a fitting connected to a quartz tube or pipe entering the upper heater 7b at connection 31 for feeding an internal conduit 32. The internal conduit 32 preferably has an annular shape and communicates with exhaust channel 14 by a plurality of holes or by a porous media. The internal conduit 32 preferably communicates with channel 14 in a region where the deposit of polycrystalline solid naturally takes place in the prior art devices. In the case where the parasitic polycrystalline deposition takes place over a wide area on the surface 26, a second or several more separate channels 32 are machined into heater 7b to deliver appropriate etch gas flows over the entire surfaces desired to be kept free of such deposits. This second etch gas flow feeding system serves two purposes. The first one is to prevent the nucleation and growth of polycrystalline grains along surfaces 26 and 27. The etch gas flow rate may however also be adjusted to a value higher than needed for this sole first purpose to also etch the sides 25b of the growing single crystal 15. The halogen to hydrogen ratio of this second gas mixture may be adjusted to value to produce a smooth mirror-like etch of the sides of the growing crystal 15. By varying the etch gas flow rates, the diameter of the growing crystal is controlled. In particular, a low etch flow allows the crystal to expand at a radial rate determined by the chosen balance of the etch gas flow versus the source and carrier gases feeding rate into heater 7a and the radial temperature gradient of heater 7b. The expansion rate of the crystal may be lowered or even cancelled to produce a cylindrically shaped crystal by increasing the etch gas flow rate. During this process, the shaft unit 16 is preferably rotated to produce a uniform radial shape.

Another advantage of this second delivery means, is that in the temperature range of preferred embodiments of the invention, the use of an etch gas containing at least an halogen element such as Cl forms stable chlorides with several metallic impurities which may unintentionally be released into the source gas feed mixture. In particular, the concentration of residual metallic impurities in the single crystal 15 could be decreased by a factor up to 100, below values detectable by state-of-the-art SIMS measurements, when a small amount of Cl containing gas is allowed to diffuse to the single crystal growth fronts 25a and 25b.

Figure 4:
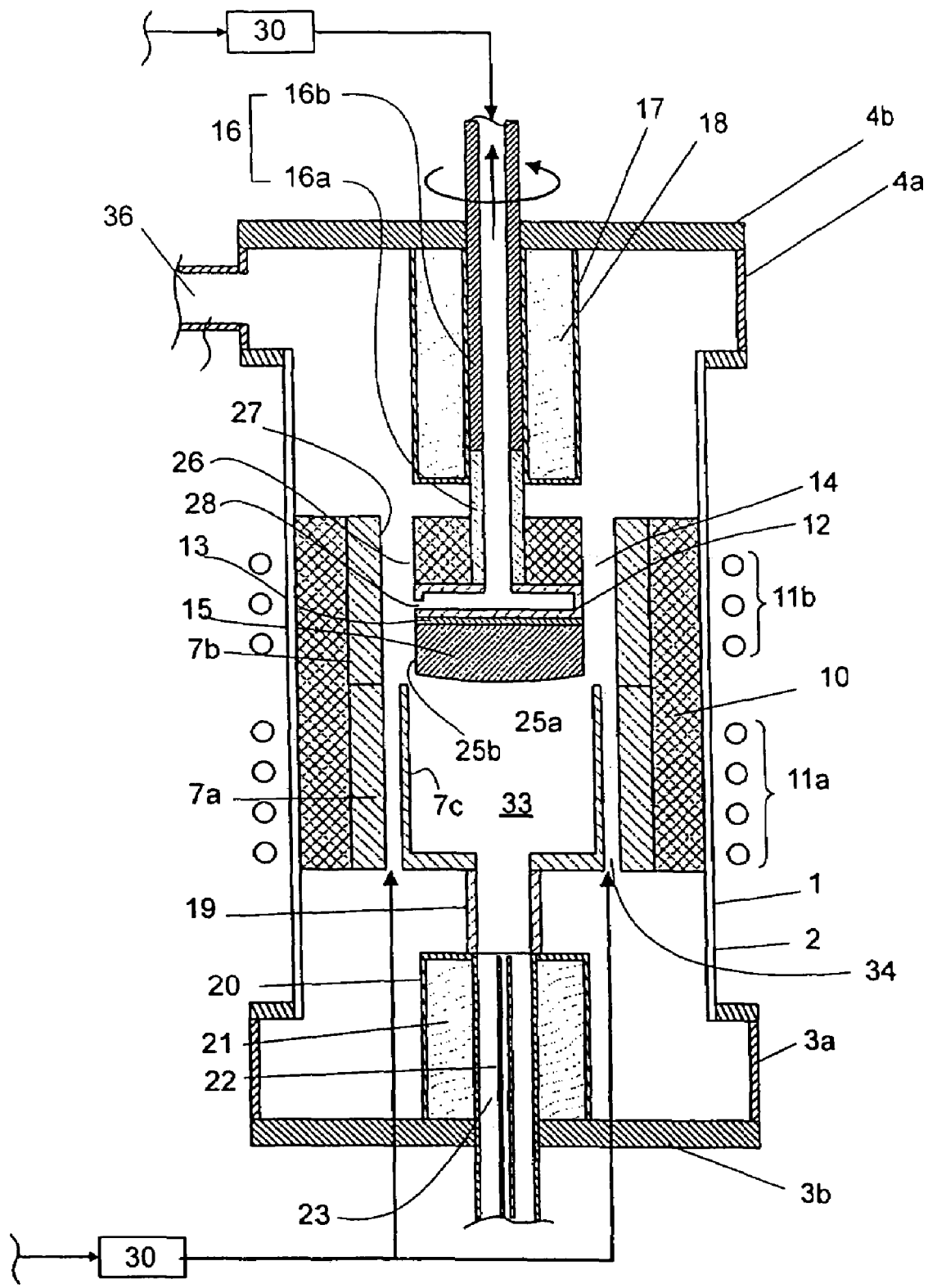
FIG. 4 is a cross section of a modified device according to an embodiment of the invention.

A third delivery means for the etch gas mixture fulfilling the purposes of preferred embodiments of the invention comprises feeding the etch gas along a circumferential gap formed between the inner wall of heater 7a and a concentric axis symmetric inner crucible 7c. As shown in FIG. 4, a flow of the Si and C containing source vapor may be confined into the growth zone 33 until its flow sweeps across the outer surface 25b of the single crystal 15 and may be exhausted into channel 14, while the etch gas flow may be confined in the annular gap 34 until the etch gas flow meets the remaining Si and C containing gases in channel 14. As in the second delivery means, this third configuration of etch gas flow allows to both maintain surfaces 26 and 27 free from detrimental polycrystalline deposits while it also allows to influence the shape of the growing single crystal. A cylindrical external wall of the inner crucible 7c will be preferred to produce an essentially cylindrical ingot 15, while an external wall either diverging along the etch gas flow direction can favor a concave growth front 25a.

It is in the scope of preferred embodiments of the invention to use either first, second or third delivery means described above, individually or in any combination. Preferred embodiments of the invention are however best practiced by using the first delivery mean during the entire duration of the process, which may extend to several tens of hours, whereas second and third delivery means may preferentially be used additionally, separately or together, at different stages of the process. A typical example can be a crystal diameter expansion stage based on delivery means 1 and 2 in a first stage, followed by a substantially cylindrical growth using also means 2 with a lower etch gas flow or in combination with delivery means 3.

Figure 1:
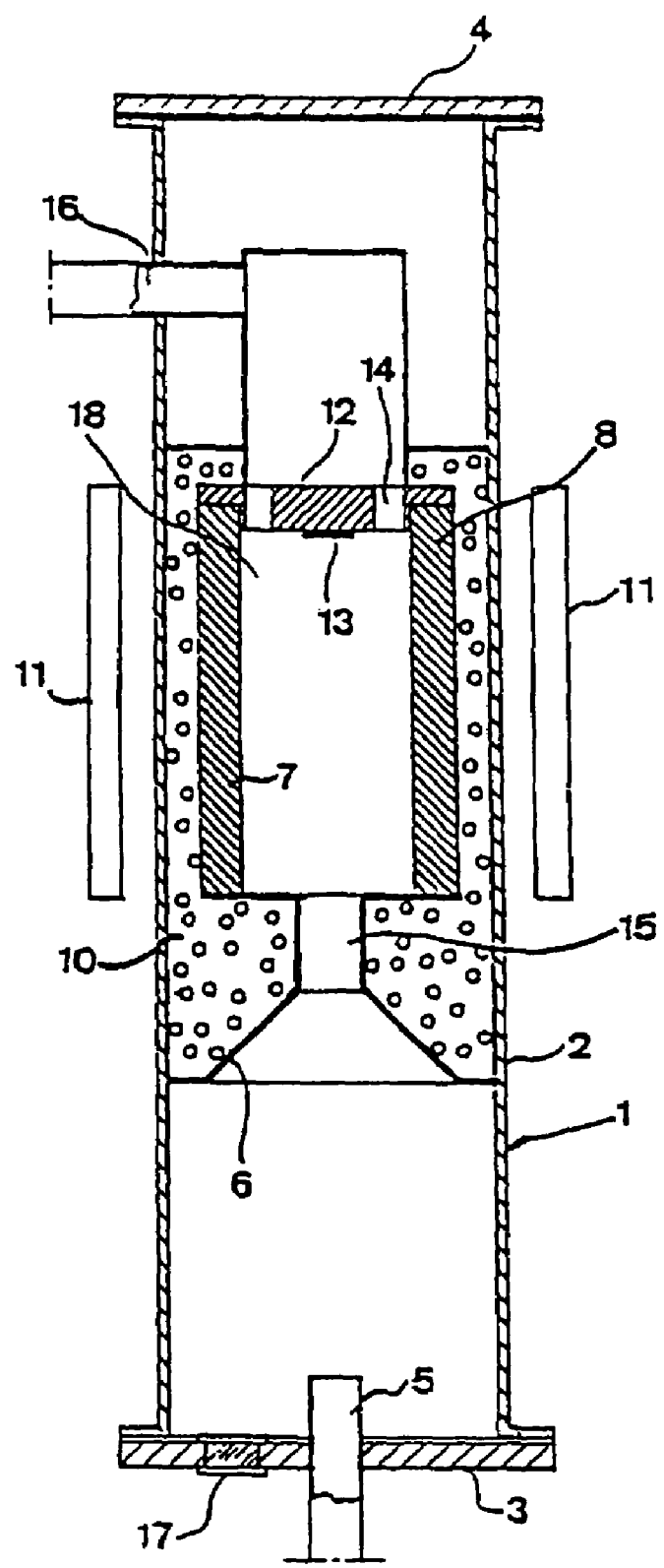
FIG. 1 illustrates a prior-art HTCVD growth device.
Figure 2:
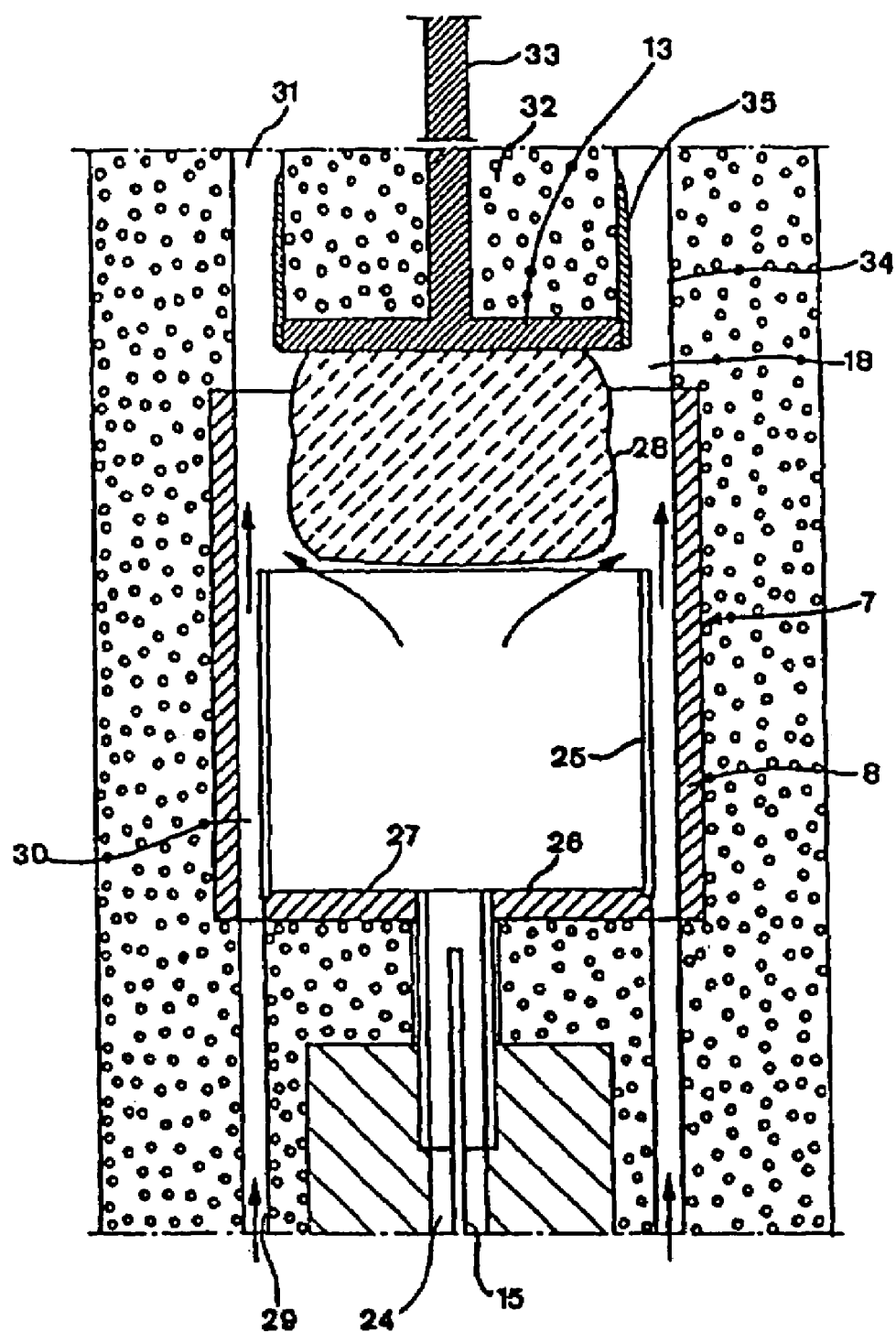
FIG. 2 illustrates another prior-art HTCVD growth device.

It may be noted that these features can be used to achieve the desired solution for a variety of exhaust channel 14 configurations, such as an exhaust direction opposite to the single crystal growth direction, as in FIG. 2, or an exhaust perpendicular to the growth direction or any intermediate angle between the opposite and perpendicular directions.

An important practice of the method taught by preferred embodiments of the present invention involves the choice of the halogen and hydrogen gas flow rates and their respective ratios. Although the authors do not wish to be bound by any theory, teaching in the method can be gained by thermodynamics considerations. These are in the following given in the Si—C—H—Cl system, however similar findings can be made for the case of III-nitrides crystal growth using for example the Ga—N—H—Cl or the Al—N—H—Cl systems.

In the following, the specific case of adding chlorine to a given Si—C—H system determined by the input source and carrier gas mixtures (for example $SiH_4$, $C_3H_8$ and $H_2$) is given. The effect of adding Cl to the Si—C—H system is known from the prior-art in SiC CVD at temperatures in the range of 1500-1600° C. to only weakly enhance the SiC etching rate. Typical etching conditions in a prior art hot-wall CVD system involve Cl/H ratios lower than 0.03% and show a weaker dependence of the etch rate with increasing HCl input than with increasing $H_2$ input feed rates [Zhang et al., Mat. Sci. Forums Vols. 389-393 (2002) p. 239]. In the prior-art, the etch rates are too low (less than 10 µm/h at 1600° C.) for any useful practice of preferred embodiments of the present invention. It will here be shown that preferred embodiments of the invention shall be practiced under much higher Cl/H to obtain etch rates ranging from 0.1 to more than 1 mm/h.

A quantification of the supersaturation decrease in the Si—C—H by addition of Cl can be quantified into a temperature drop: when Cl is added, how much can the temperature drop until the supersaturation increases again to the original value? The initial Si—C—H composition may be defined from the input source mixture and the calculations are performed by driving the system to equilibrium. A given amount of Cl may be added to the system, which may decrease the supersaturation of the system, by formation of e.g. chlorosilanes. The temperature may then be let to drop an amount ΔT that increases the level of supersaturation. The system may then be driven to new gas phase equilibrium and compared to the initial state. The temperature difference ΔT corresponding to a given amount of [Cl] can then be obtained from the supersaturation (SS) isoline equal to 1 in contour plots such as the ones of FIGS. 5 and 6. Along this isoline, SS(T, Si, C, H)=SS(T−ΔT, Si, C, H, Cl).

Figure 5:
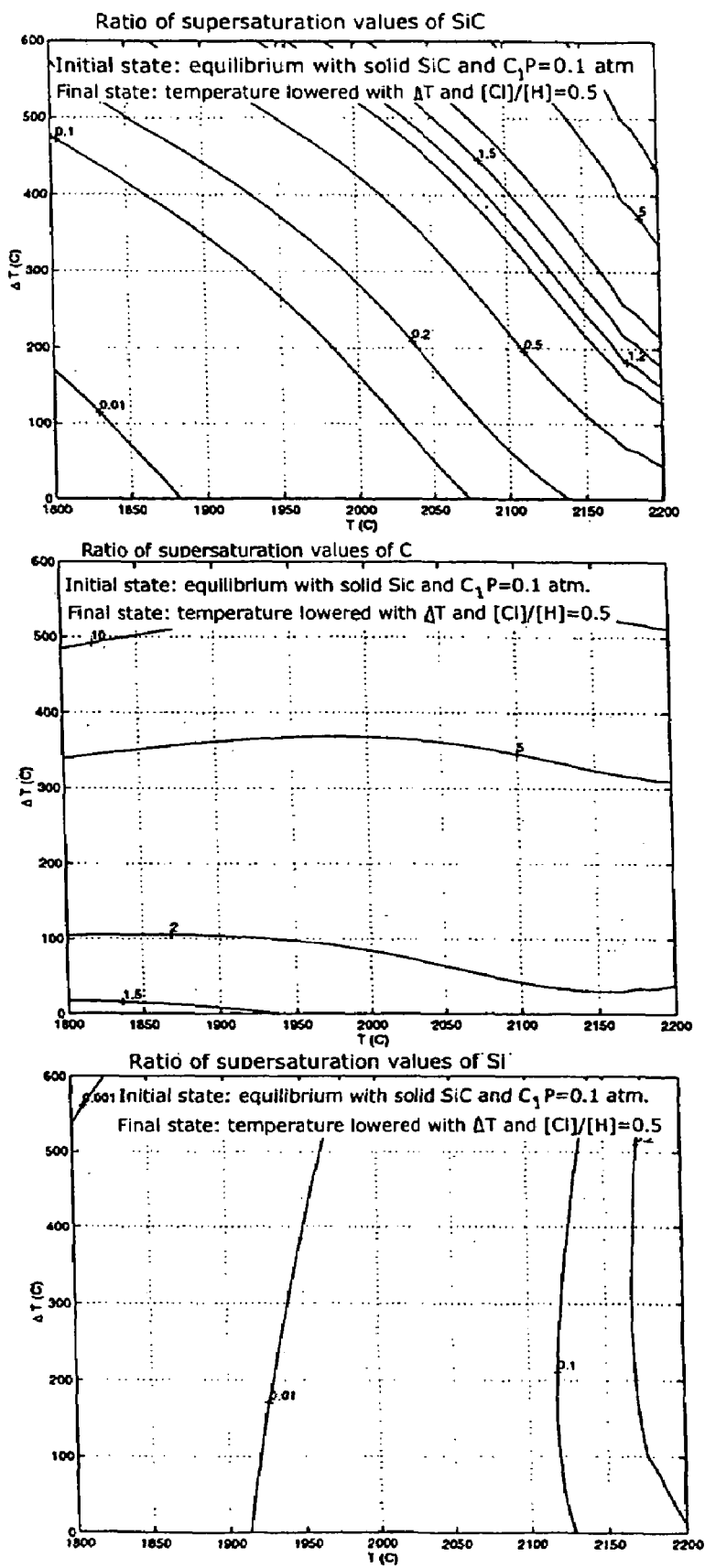
FIG. 5 shows the ratio of supersaturation of the SiC (top graph), carbon (middle) and silicon (bottom) condensed species with a [Cl]/[H] ratio of 0.5.

FIG. 5 shows the result in the case of a system operated at a reduced pressure of 0.12 bar and a [Cl]/[H] ratio of 0.5. In particular FIG. 5 indicates that the problem of blocking channel 14 is at least partially solved in this case: the growth of solid SiC may be greatly reduced and the growth of Si may be stopped altogether. Unfortunately, at high temperature where the Si and C content in the gas phase is large, the effect of Cl is smaller. At 2200° C., the Cl may allow to delay any substantial solid phase deposition along a 200° C. temperature drop ΔT, while at 1900° C. this drop can exceed 600° C.

Figure 6:
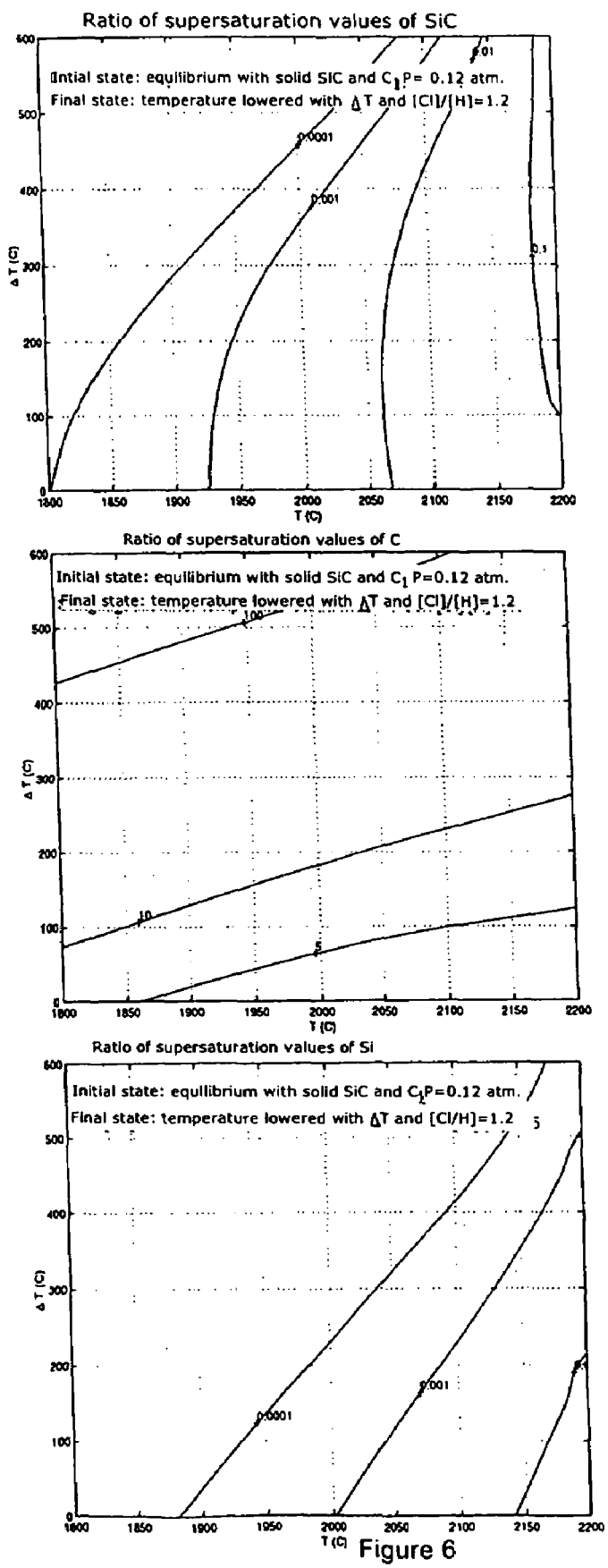
FIG. 6 shows the ratio of supersaturation of the SiC, carbon and silicon condensed species with a [Cl]/[H] ratio of 1.2.

Using an etch gas mixture with ratio of [Cl]/[H] higher than 1, the formation of solid deposits can be completely removed. As shown in FIG. 6 where a [Cl]/[H] ratio of 1.2 is used for the same pressure and initial composition as FIG. 5, even along a temperature drop ΔT of 600° C., no solid phases of SiC, or Si are possible. A solid phase of C may deposit (e.g. pyrolitic graphite) as the C supersaturation is however higher than 1. If this deposit is large enough to eventually obstruct the channel 14 within a time of 20 to 40 hours, it can be removed by exercising the invention, that is, by supplying an additional flow of H2 in the cooler region where no more solid SiC deposit occurs. This additional flow of hydrogen may be fed in a dedicated channel going through the shaft unit 16 or in a separate channel going though the heater 7, using the principles described earlier.

The large single crystals grown according to preferred embodiments of the invention may be sliced and polished into thin wafers for semiconductor applications or may be used for other applications. Depending on the intended use of the crystals, it is understood that these may be doped to achieve either low n- or p-type resistivity or made very pure to achieve a high resistivity. Dopants such as nitrogen, aluminum or other elements are preferably introduced into the growth room 33 by a controlled flow of a gas or metalorganic precursor as is commonly done in SiC CVD and group-III MOCVD of thin layers for semiconductor applications.

Furthermore, preferred embodiments of the invention may also be employed in a sublimation or PVT system to keep free of deposits effusions paths used to remove from the crystallization front either impurities or non-stoichiometric components of the vapor sublimed from a solid or liquid source.

Although it has been indicated in the figures and in the above description that the flow of source gases is directed upwards (substantially against the direction of the local gravity vector), it is within the scope of the invention to arrange the device in the opposite direction, where the seed crystal is located at the bottom of the device, or to employ an horizontal direction, where the seed holder is either located downwards or upwards. In its present description the growth room 33 may either be maintained at a substantially atmospheric pressure or to a low pressure in the range of 50 to 800 mbar, however for other orientations of the device, a low pressure, for example less than 500 mbar, may be required to achieve the desired single crystal growth rates.

It may be noted that a person having skill and experience in the art will readily recognize that several components, shapes and process parameters may be varied or modified to a certain extent without departing from the scope and intention of the invention.

The invention claimed is:

1. A method for growing large, single polytype, compound crystals of one of a) silicon carbide, b) a group III-nitride c) alloys thereof, the method comprising:
providing, in a heated growth enclosure comprising a seed crystal, a mixture of vapor species containing at least the elements of the compound crystal, in such a way that, at least one of the elements is continuously fed into the enclosure through an opening upstream of a growth surface of said crystal,
removing from the enclosure through an opening downstream of the growth surface of said crystal a continuous flow of remaining vapor species not having been deposited under conditions yielding to growth of said crystal, and
providing in the enclosure an etching gas flow containing at least one halogen element, in such a way that, said gas flow is heated and decreases a deposition rate of solid phases downstream of the growth surface of said crystal.

2. The method according to claim 1, further comprising:
heating at least one region of the growth enclosure in the upstream vicinity of said crystal to a temperature of at least 1900° C.,
continuously feeding at least a silicon gas precursor, and either an hydrocarbon gas precursor or a combination thereof with vapor sublimed from a solid or liquid source towards said crystal, and
providing said additional etch gas flow comprising at least Cl or F.

3. The method according to claim 2, further comprising:
providing said additional etch gas flow consisting of chlorine (Cl2) or hydrogen chloride (HCl) or hydrogen (H2) or fluorine (F2) or a mixture thereof.

4. The method according to claim 1, further comprising:
heating at least one region of the growth enclosure in the upstream vicinity of said crystal to a temperature of at least 1100° C.,
continuously feeding at least a gallium or aluminum metalorganic precursor and a nitrogen containing gas towards said crystal, and
providing said additional etch gas flow.

5. The method according to claim 4, further comprising:
providing said additional etch gas flow consisting of chlorine (Cl2) or hydrogen chloride (HCl) or hydrogen (H2) or hydrogen iodide (HI) or iodine (I2) or a mixture thereof.

6. The method according to claim 1, further comprising:
placing the seed on a seed holder being mounted on a rotating and pulled shaft and
feeding said additional etch gas flow through the shaft to be delivered downstream of the growth surface of said crystal.

7. The method according to claims 1, further comprising:
feeding said additional etch gas flow into at least one channel emerging from a heated crucible into a region upstream of an initial position of the seed crystal before it is pulled for a substantial amount of time.

8. The method according to claim 1, wherein said additional etch gas flow is fed into a conduit formed between an outer heater and an inner crucible, said inner crucible extending along a symmetry axis parallel to said crystal growth direction and terminating in the immediate upstream vicinity of the initial seed crystal position.

9. The method according to claim 1, further comprising:
continuously feeding a carrier gas with the vapor species mixture comprising at least the elements of the compound crystal, said carrier gas comprising hydrogen, nitrogen, helium or argon or a blend thereof.

10. The method according to claim 1, where a halogen to hydrogen ratio of the etching gas flow is adjusted to a value operative to prevent formation of solid deposits along a surface desired to be maintained free of solid deposits.

11. The method according to claim 1, further comprising:
utilizing a flow rate and a delivery means of the etching gas flow to control a crystal diameter.

12. The method according to claim 2, wherein the at least a silicon gas precursor comprises silane, a chlorosilane or a methylsilane.

13. The method according to claim 2, wherein the at least one region of the growth enclosure in the upstream vicinity of the crystal is heated to a temperature in a range of 2000 to 2600° C.

14. The method according to claim 4, wherein the at least one region of the growth enclosure in the upstream vicinity of said crystal is heated to a temperature in the range of 1200 to 2200° C.

15. The method according to claim 4, wherein the additional etch gas flow comprises Cl or I.

16. The method according to claim 11, wherein the crystal diameter is controlled to either maintain the crystal substantially cylindrical or allow the crystal to expand.

* * * * *